(12) United States Patent
Xie et al.

(10) Patent No.: US 11,437,489 B2
(45) Date of Patent: Sep. 6, 2022

(54) TECHNIQUES FOR FORMING REPLACEMENT METAL GATE FOR VFET

(71) Applicant: International Business Machines Corporation, Armonk, NY (US)

(72) Inventors: Ruilong Xie, Niskayuna, NY (US); Heng Wu, Guilderland, NY (US); Chanro Park, Clifton Park, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 16/585,403

(22) Filed: Sep. 27, 2019

(65) Prior Publication Data

US 2021/0098602 A1    Apr. 1, 2021

(51) Int. Cl.
| | | |
|---|---|---|
| *H01L 29/165* | (2006.01) | |
| *H01L 29/66* | (2006.01) | |
| *H01L 29/267* | (2006.01) | |
| *H01L 29/78* | (2006.01) | |
| *H01L 29/08* | (2006.01) | |
| *H01L 21/8234* | (2006.01) | |
| *H01L 27/088* | (2006.01) | |

(52) U.S. Cl.
CPC ............. *H01L 29/66545* (2013.01); *H01L 21/823418* (2013.01); *H01L 21/823431* (2013.01); *H01L 21/823487* (2013.01); *H01L 27/0886* (2013.01); *H01L 29/0847* (2013.01); *H01L 29/267* (2013.01); *H01L 29/66666* (2013.01); *H01L 29/66795* (2013.01); *H01L 29/785* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 8,058,137 B1 | 11/2011 | Or-Bach et al. | |
| 9,530,866 B1 * | 12/2016 | Zhang | H01L 29/0676 |
| 9,780,208 B1 | 10/2017 | Xie et al. | |
| 9,859,421 B1 | 1/2018 | Robinson et al. | |

(Continued)

*Primary Examiner* — Joseph C. Nicely
*Assistant Examiner* — Lamont B Koo
(74) *Attorney, Agent, or Firm* — Samuel Waldbaum; Michael J. Chang, LLC

(57) ABSTRACT

RMG techniques for VFET formation using a chamfering process are provided. In one aspect, a method of forming a VFET device includes: patterning fins adjacent to one another in a substrate; forming bottom source/drains at a base of the fins; forming bottom spacers over the bottom source/drains; forming sacrificial gates alongside the fins; forming top source/drains at a top of the fins; forming top spacers surrounding the top source/drains; removing the sacrificial gates; depositing a high-κ gate dielectric along sidewalls of the fins; removing the high-κ gate dielectric from an opening between adjacent top spacers; depositing at least a first workfunction-setting metal layer onto the high-κ gate dielectric; removing the first workfunction-setting metal layer from the opening between the adjacent top spacers; and depositing at least a second workfunction-setting metal layer onto the first workfunction-setting metal layer to form replacement metal gates. A VFET device is also provided.

8 Claims, 18 Drawing Sheets

(56) References Cited

U.S. PATENT DOCUMENTS

| | | |
|---|---|---|
| 9,985,115 B2 | 5/2018 | Anderson et al. |
| 10,037,919 B1 | 7/2018 | Xie et al. |
| 10,103,247 B1 | 10/2018 | Xie et al. |
| 2011/0049577 A1 | 3/2011 | Or-Bach et al. |
| 2017/0294537 A1* | 10/2017 | Cheng ............... H01L 29/66742 |
| 2018/0006118 A1 | 1/2018 | Mallela et al. |
| 2018/0019337 A1* | 1/2018 | Xie ................... H01L 29/66666 |
| 2018/0254330 A1* | 9/2018 | Bao ................. H01L 21/823468 |

* cited by examiner

TECHNIQUES FOR FORMING REPLACEMENT METAL GATE FOR VFET

FIELD OF THE INVENTION

The present invention relates to vertical field-effect transistors (VFETs), and more particularly, to techniques for forming a replacement metal gate (RMG) for a VFET using a work function metal (WFM) chamfering process.

BACKGROUND OF THE INVENTION

As opposed to planar complementary metal-oxide-semiconductor (CMOS) devices, vertical field effect transistors (VFETs) are oriented with a vertical fin channel disposed on a bottom source/drain and a top source/drain disposed on the fin channel. VFETs have been pursued as a potential device option for scaling CMOS to the 5 nanometer (nm) node and beyond.

A gate-last gate process employs a sacrificial gate during formation of the source/drains. At the end of the process, the sacrificial gate is replaced with a final gate of the device (also referred to herein as a 'replacement' gate). When the replacement gate is a metal gate, it is also referred to herein as a 'replacement metal gate' or RMG. By way of this sequence of steps, the gate-last process advantageously avoids exposing the replacement gate materials such as high-κ dielectrics to potentially damaging conditions such as the high temperatures experienced during source/drain formation.

Implementing a RMG in a VFET process flow presents some notable challenges. For instance, the sacrificial gate is removed from alongside the sidewalls of the vertical channels, and replaced with the RMG metals. However, due to the vertical nature of the design, the deposited RMG metals can experience early pinch-off at the top source/drains of adjacent VFETs before full deposition of the gate stack occurs, undesirably resulting in voids.

Therefore, improved RMG techniques for VFET formation would be desirable.

SUMMARY OF THE INVENTION

The present invention provides replacement metal gate (RMG) techniques for vertical field-effect transistor (VFET) formation using a work function metal (WFM) chamfering process. In one aspect of the invention, a method of forming a VFET device is provided. The method includes: patterning fins adjacent to one another in a substrate corresponding to at least a first VFET (VFET1) and a second VFET (VFET2); forming bottom source and drains in the substrate at a base of the fins; forming bottom spacers over the bottom source and drains; forming sacrificial gates alongside the fins; forming top source and drains at a top of the fins; forming top spacers surrounding the top source and drains; removing the sacrificial gates, wherein following removal of the sacrificial gates the top spacers overhang the fins; depositing a high-κ gate dielectric along sidewalls of the fins and on the bottom spacers and the top spacers; removing the high-κ gate dielectric from an opening between adjacent top spacers; depositing at least a first workfunction-setting metal layer onto the high-κ gate dielectric along the sidewalls of the fins and on the bottom spacers and the top spacers; removing the first workfunction-setting metal layer from the opening between the adjacent top spacers; and depositing at least a second workfunction-setting metal layer onto the first workfunction-setting metal layer along the sidewalls of the fins and on the bottom spacers and the top spacers to form replacement metal gates of the VFET1 and the VFET2.

In another aspect of the invention, a VFET device is provided. The VFET device includes: fins patterned adjacent to one another in a substrate corresponding to at least a first VFET (VFET1) and a second VFET (VFET2); bottom source and drains formed in the substrate at a base of the fins; bottom spacers disposed over the bottom source and drains; top source and drains formed at a top of the fins; top spacers surrounding the top source and drains, wherein the top spacers overhang the fins; and gates of the VFET1 and the VFET2 including: a high-κ gate dielectric disposed along sidewalls of the fins and on top surfaces of the bottom spacers and bottom surfaces of the top spacers, at least a first workfunction-setting metal layer disposed on the high-κ gate dielectric, and at least a second workfunction-setting metal layer disposed on the first workfunction-setting metal layer.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for vertical field effect transistor (VFET) fabrication with replacement metal gate (RMG) that employ a unique chamfering process. An exemplary methodology for VFET device fabrication in accordance with the present techniques is now described by way of reference to FIGS. 1-18.

Figure 1:
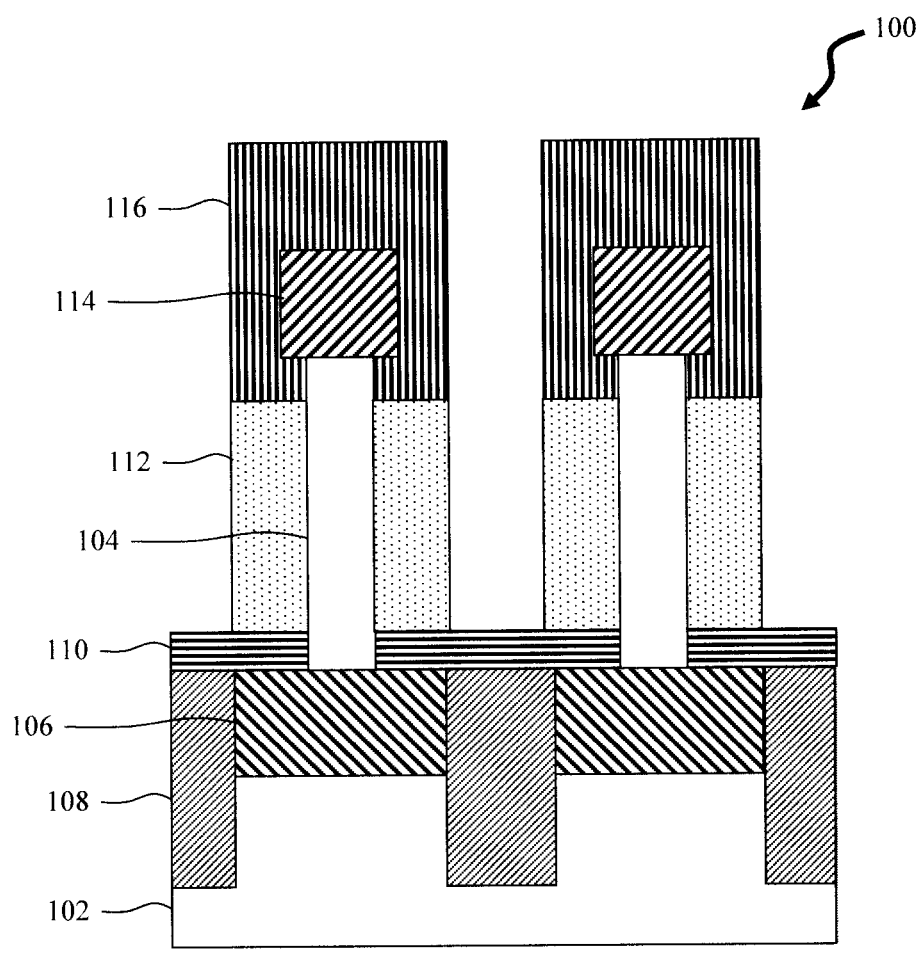
FIG. 1 is a cross-sectional diagram illustrating a vertical field effect transistor (VFET) structure having fins patterned adjacent to one another in a substrate (corresponding to at least a first VFET device (VFET1) and a second VFET device (VFET2)), bottom source and drains formed in the substrate at the base of the fins, isolated by shallow trench isolation (STI) regions, bottom spacers formed over the bottom source and drains, sacrificial gates formed alongside the fins, top source and drains formed at a top of the fins, and top spacers formed surrounding the top source and drains according to an embodiment of the present invention.

As shown in FIG. 1, the process begins with a VFET structure 100 having fins 104 (i.e., vertical channels) patterned adjacent to one another in a substrate 102 (corresponding to at least a first VFET device (VFET1) and a second VFET device (VFET2)—see below), bottom source and drains 106 in the substrate 102 at the base of the fins, isolated by shallow trench isolation (STI) regions 108, bottom spacers 110 over the bottom source and drains 106, sacrificial gates 112 alongside the fins 104, top source and drains 114 at a top of the fins 104, and top spacers 116 surrounding the top source and drains 114. See, for example, U.S. Pat. No. 9,780,208 issued to Xie et al., entitled "Method and Structure of Forming Self-Aligned RMG Gate for VFET," the contents of which are incorporated by reference as if fully set forth herein.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Standard lithography and etching techniques can be employed to pattern fins 104 in the substrate 102.

According to an exemplary embodiment, bottom source and drains 106 are formed in substrate 102 using an ion implantation process to introduce dopants at the base of the fins 104. Suitable n-type dopants include, but are not limited to, phosphorous (P) and/or arsenic (As), and suitable p-type dopants include, but are not limited to, boron (B). Ion implantation is, however, only one of the techniques contemplated herein for forming the bottom source and drains 106. For instance, a thermally-driven diffusion of dopants from a highly-doped epitaxial material (such as phosphorous-doped epitaxial Si (Si:P) or boron-doped epitaxial SiGe (SiGe:B)) deposited between the fins (not shown) can instead be used to form the bottom source and drains 106.

Suitable materials for the bottom spacers 110 include, but are not limited to, oxide spacer materials such as silicon dioxide ($SiO_2$) and/or silicon oxycarbide (SiOC) and/or nitride spacer materials such as silicon nitride (SiN) and/or silicon-boron-nitride (SiBN). According to an exemplary embodiment, bottom spacers 110 are formed using a directional deposition process whereby a greater amount of the spacer material is deposited on horizontal surfaces (including on top of the bottom source and drains 106), as compared to vertical surfaces (such as along sidewalls of the fins 104). Thus, when an etch is used on the spacer material, the timing of the etch needed to remove the spacer material from the vertical surfaces will leave the bottom spacers 110 shown in FIG. 1 on the bottom source and drains 106. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

Suitable materials for sacrificial gates 112 include, but are not limited to, amorphous silicon and/or polysilicon. Use of sacrificial gates 112 permits placement of the bottom and top source and drains 106 and 114, which are offset from the gate by the bottom and top spacers 110 and 116 respectively. According to an exemplary embodiment, the top source and drains 114 are formed from epitaxial Si, Ge and/or SiGe that is in-situ (during epitaxial growth) or ex-situ (such as via ion implantation) doped with an n-type or p-type dopant. As provided above, suitable n-type dopants include, but are not limited to, phosphorous (P) and/or arsenic (As), and suitable p-type dopants include, but are not limited to, boron (B). Suitable materials for the top spacers 116 include, but are not limited to, oxide spacer materials such as $SiO_2$ and/or SiOC and/or nitride spacer materials such as SiN and/or SiBN.

Figure 2:
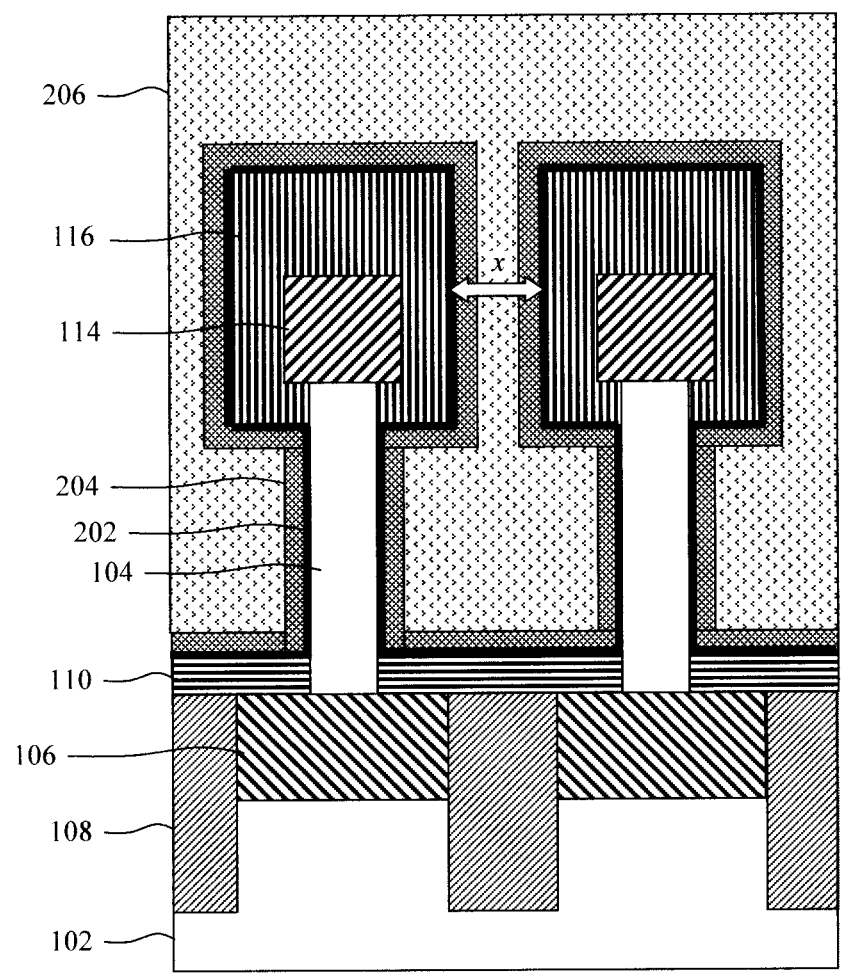
FIG. 2 is a cross-sectional diagram illustrating the sacrificial gates having been removed whereby, following removal of the sacrificial gates, the top source and drains/top spacers overhang the fins, a high-κ gate dielectric having been deposited along the (now-exposed) sidewalls of the fins as well as on the bottom and top spacers, a sacrificial liner having been deposited onto the high-κ gate dielectric, and the fins having been buried in a (first) sacrificial layer according to an embodiment of the present invention.

Next, as shown in FIG. 2, the sacrificial gates 112 are removed. Sacrificial gates 112 can be removed using an amorphous silicon or polysilicon-selective etching process. For instance, according to an exemplary embodiment, the sacrificial gates 112 are removed using a selective wet etching process such as hot ammonia or tetra methyl ammonium hydroxide (TMAH).

Following removal of sacrificial gates 112, the top source and drains 114/top spacers 116 overhang the fins 104. As will be described in detail below, the sacrificial gates 112 will be replaced with a replacement metal gate (RMG) along the sidewalls of fins 104. However, as highlighted above, if one were to simply deposit all of the RMG materials at once, the opening x between adjacent top spacers 116 (see FIG. 2) will quickly become pinched off, oftentimes before all of the material has been deposited. The undesirable result is the formation of voids. Advantageously, the present techniques provide a unique process whereby the RMG materials are deposited in stages with a chamfering step performed after each deposition stage to remove the RMG materials from the opening x between the adjacent top spacers 116. Doing so prevents build-up of the RMG materials in that opening x, thereby preventing pinch-off and potential void formation.

Removal of the sacrificial gates 112 exposes the sidewalls of fins 104. Replacement metal gate (RMG) formation then begins with the deposition of a high-κ gate dielectric 202 along the (now-exposed) sidewalls of fins 104, as well as on the bottom and top spacers 110 and 116, respectively. See FIG. 2. The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$), lanthanum oxide ($La_2O_3$), zirconium oxide ($ZrO_2$), aluminum oxide ($Al_2O_3$), titanium oxide ($TiO_2$) and/or tantalum oxide ($Ta_2O_5$). The high-κ gate dielectric 202 can be deposited using a conformal deposition process such as chemical vapor deposition (CVD), atomic layer deposition (ALD) or physical vapor deposition (PVD). Prior to depositing high-κ gate dielectric 202, an interfacial oxide (not shown), e.g., $SiO_2$ which may include other chemical elements in it such as nitrogen, germanium, etc., is preferably first formed selectively on exposed (e.g., Si/SiGe) surfaces of the fins 104 by an oxidation process to a thickness of from about 0.3 nm to about 5 nm, and ranges therebetween, e.g., about 1 nm.

As shown in FIG. 2, a sacrificial liner 204 is deposited onto the high-κ gate dielectric 202. Suitable materials for the sacrificial liner 204 include, but are not limited to, metal nitrides such as titanium nitride (TiN) and/or tantalum nitride (TaN). The sacrificial liner 204 can be deposited using a conformal deposition process such as CVD, ALD or PVD. According to an exemplary embodiment, sacrificial liner 204 is deposited to a thickness of from about 2 nanometers (nm) to about 10 nm, and ranges therebetween. The sacrificial liner 204 prevents contact between high-κ gate dielectric 202 and the sacrificial layer 206 that is next deposited over the fins 104 (see below). Contact between high-κ gate dielectric 202 and sacrificial layer (e.g., OPL—see below) 206 could undesirably lead to oxidation of the high-κ gate dielectric 202. Preferably, sacrificial liner 204 is formed from a different material than the bottom/top spacers 110 and 116 in order to provide etch selectivity. For instance, to use an illustrative, non-limiting example, when sacrificial liner 204 is formed from a metal nitride (e.g., TaN and/or TiN), bottom/top spacers 110 and 116 are preferably formed from an oxide material (e.g., $SiO_2$ and/or SiOC).

As highlighted above, a chamfering process is then used to remove high-κ gate dielectric 202 and sacrificial liner 204 from the opening x between the adjacent top spacers 116. To do so, as shown in FIG. 2, fins 104 are buried in a (first) sacrificial layer 206. Suitable materials for layer 206 include, but are not limited to, organic planarizing layer (OPL) materials deposited using a casting process such as spin-coating or spray coating. Suitable OPL materials include, but are not limited to, aromatic cross-linkable polymers (such as naphthalene-based polymers).

Figure 3:
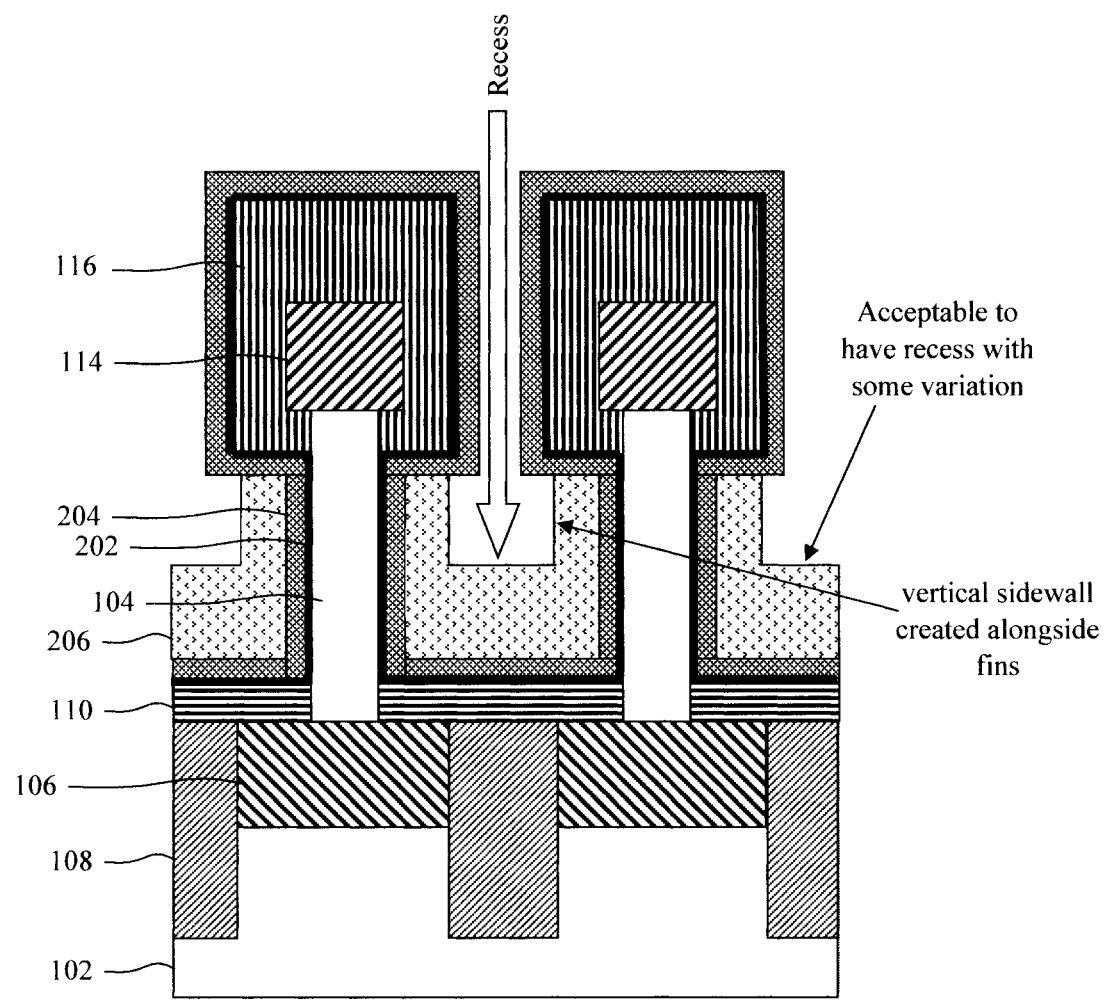
FIG. 3 is a cross-sectional diagram illustrating the first sacrificial layer having been recessed below the top spacers according to an embodiment of the present invention.
Figure 4:
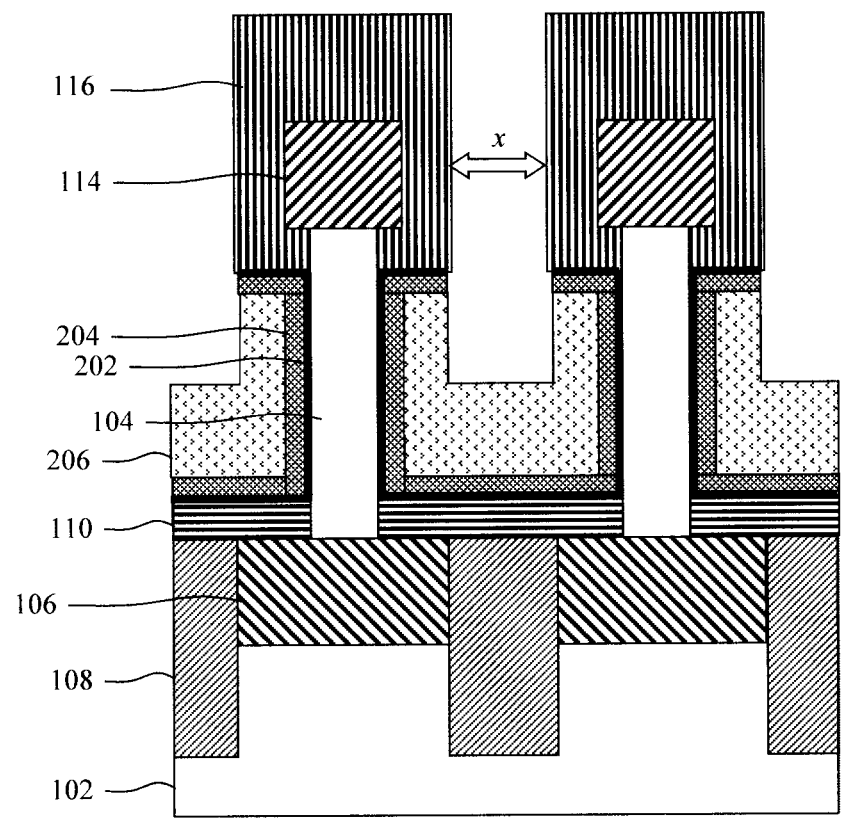
FIG. 4 is a cross-sectional diagram illustrating the high-κ gate dielectric and sacrificial liner exposed by recessing of the first sacrificial layer having been removed (via chamfering) selective to the top spacers according to an embodiment of the present invention.

As shown in FIG. 3, the sacrificial layer 206 is then recessed below the top spacers 116 (e.g., using an anisotropic etch, isotropic etch or combined etch having both anisotropic and isotropic components) which creates a vertical sidewall of sacrificial layer 206 alongside the fins 104 due to the overhang of the top spacers 116. See FIG. 3. Further, while FIG. 3 depicts sacrificial layer 206 recessed to a uniform depth in between the fins 104, variation in the recess depth is inconsequential.

The high-κ gate dielectric 202 and sacrificial liner 204 exposed by recessing of sacrificial layer 206 are then removed (via this chamfering step) selective to top spacers 116. See FIG. 4. Doing so removes the high-κ gate dielectric 202 and sacrificial liner 204 from the opening x between the adjacent top spacers 116. According to an exemplary embodiment, the exposed high-κ gate dielectric 202 and sacrificial liner 204 are removed using a non-directional (isotropic) etching process. For instance, metal nitrides like those employed for sacrificial liner 204 can be selectively removed using a plasma etch, and high-κ materials like those employed for high-κ gate dielectric 202 can be selectively removed using a (HF:HCl) wet chemical etch.

Figure 5:
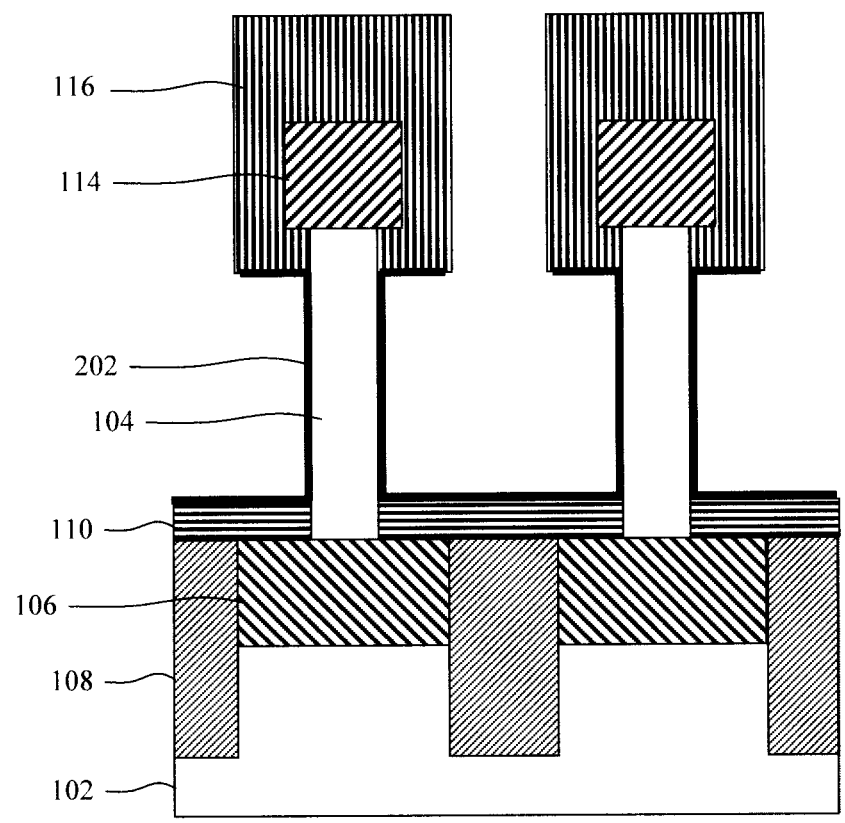
FIG. 5 is a cross-sectional diagram illustrating remaining portions of the sacrificial liner and first sacrificial layer having been removed selective to the high-κ gate dielectric according to an embodiment of the present invention.

As shown in FIG. 5, the remaining portions of sacrificial liner 204 and sacrificial layer 206 are removed selective to high-κ gate dielectric 202. For instance, OPL can be removed by ashing, metal oxide (e.g., TiN) can be removed by wet etch (such as SC1). What remains is high-κ gate dielectric 202 along the sidewalls of fins 104, along the top surface of bottom spacers 110, and along the bottom surface of top spacers 116. See FIG. 5.

Figure 6:
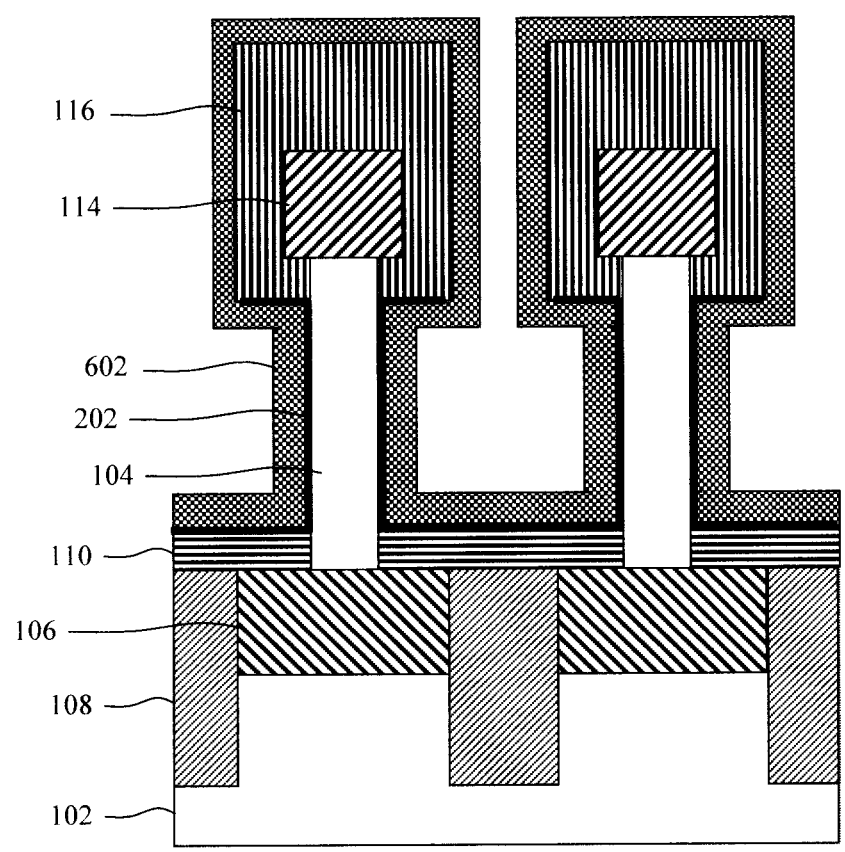
FIG. 6 is a cross-sectional diagram illustrating a first workfunction-setting metal layer having been deposited onto the high-κ gate dielectric (i.e., along the sidewalls of the fins) as well as over the bottom and top spacers according to an embodiment of the present invention.

As shown in FIG. 6, a first workfunction-setting metal layer 602 is deposited onto the high-κ gate dielectric 202 (i.e., along the sidewalls of fins 104) as well as over the bottom and top spacers 110 and 116, respectively. According to one exemplary embodiment, first workfunction-setting metal layer 602 includes one or more layers of a metal such as cobalt (Co), titanium (Ti), aluminum (Al), and/or other metal alloys that provide proper workfunction to produce a desired threshold voltage (Vt), such as titanium nitride (TiN), tantalum nitride (TaN), titanium carbide (TiC) and/or titanium aluminide (TiAl), and can be conformally deposited using a process such as CVD, ALD or PVD to a thickness of from about 5 nm to about 40 nm and ranges therebetween. In another exemplary embodiment, the metal(s) selected for first workfunction-setting metal layer 602 may be different for n-channel VFETs (nVFETs) and p-channel VFETs (pVFETs), and can be formed using processes known in the art for selectively depositing first workfunction-setting metal layer 602 containing the appropriate metal(s) for the nVFETs and pVFETs. For instance, by way example only, suitable n-type workfunction-setting metals include, but are not limited to, TiN, TaN and/or aluminum (Al)-containing alloys such as TiAl, titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Thus, the first workfunction-setting metal layer 602 for nVFETs and pVFETs could be different materials which also may have different thickness.

Figure 7:
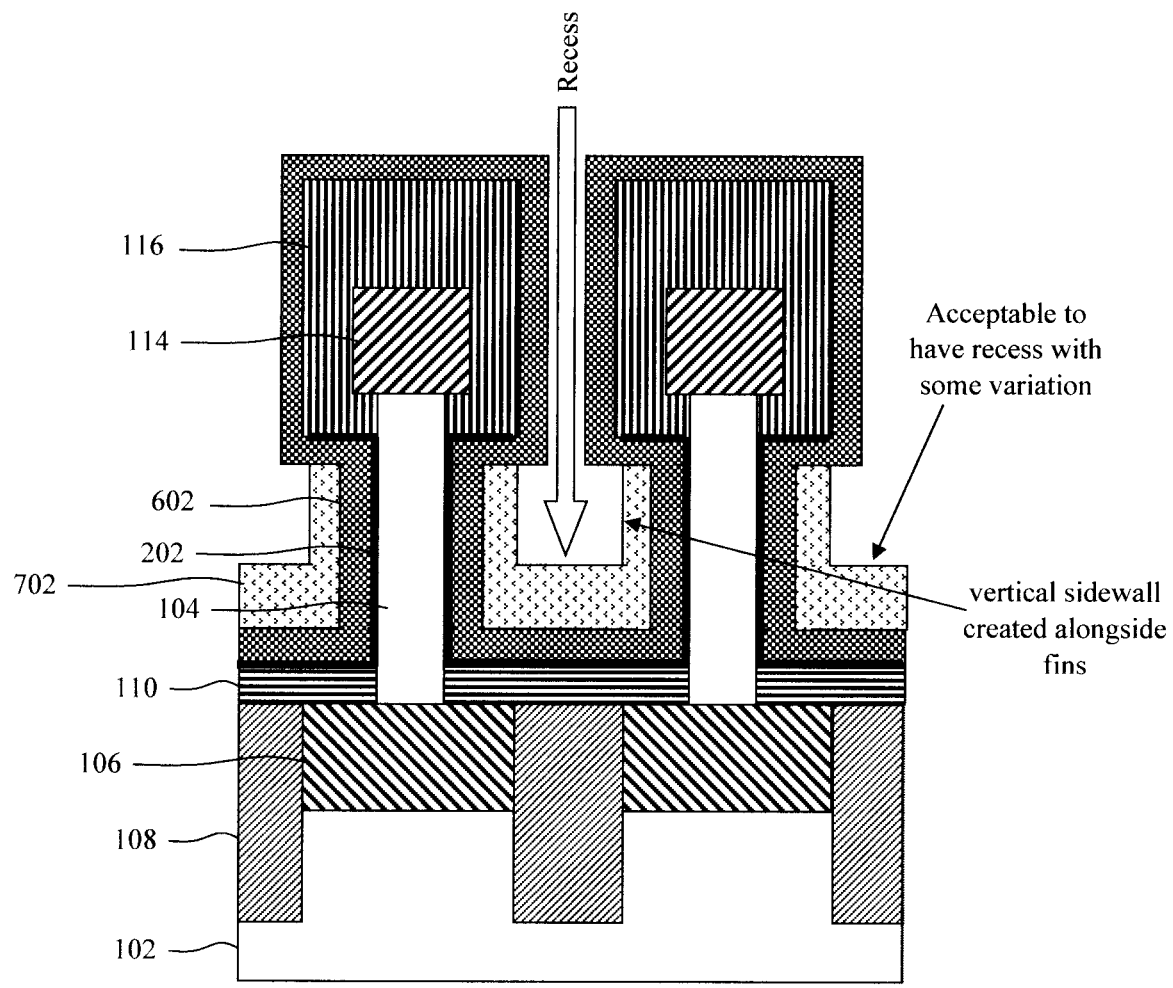
FIG. 7 is a cross-sectional diagram illustrating the fins having been buried in a (second) sacrificial layer, which is then recessed below the top spacers according to an embodiment of the present invention.
Figure 8:
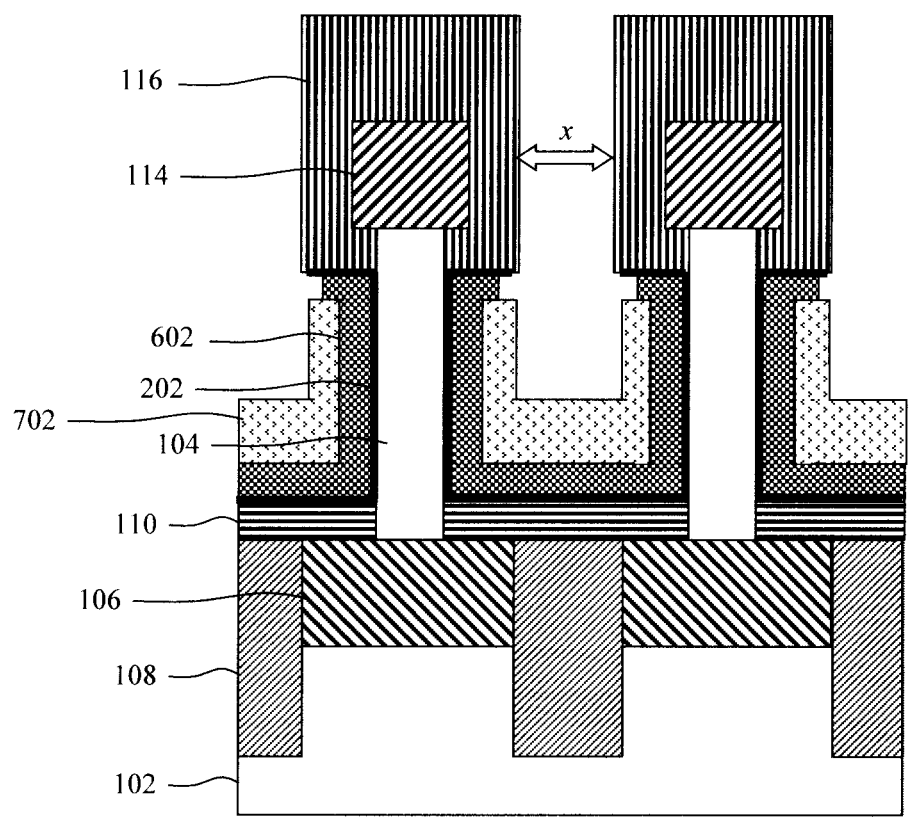
FIG. 8 is a cross-sectional diagram illustrating the first workfunction-setting metal layer exposed by recessing of the second sacrificial layer having been removed (via chamfering) selective to top spacers, and the remaining portions of the second sacrificial layer having been removed according to an embodiment of the present invention.

As highlighted above, a chamfering process is then used to remove first workfunction-setting metal layer 602 from the opening x between the adjacent top spacers 116. Namely, as shown in FIG. 7, in the same manner as described above, fins 104 are buried in a (second) sacrificial layer 702 (e.g., an OPL), which is then recessed below the top spacers 116 (e.g., using an anisotropic etch, isotropic etch or combined etch having both anisotropic and isotropic components) which creates a vertical sidewall of sacrificial layer 702 alongside the fins 104 due to the overhang of the top spacers 116. See FIG. 7. Further, while FIG. 7 depicts sacrificial layer 702 recessed to a uniform depth in between the fins 104, variation in the recess depth is inconsequential.

The first workfunction-setting metal layer 602 exposed by recessing of sacrificial layer 702 is then removed (via this chamfering step) selective to top spacers 116. See FIG. 8. Doing so removes the first workfunction-setting metal layer 602 from the opening x between the adjacent top spacers 116. According to an exemplary embodiment, the exposed first workfunction-setting metal layer 602 is removed using a non-directional (isotropic) etching process. For instance, etchants such as ammonium hydroxide (NH$_4$OH), hydrogen peroxide (H$_2$O$_2$), and/or SC1 can be used to selectively remove the metals of first workfunction-setting metal layer 602.

Following removal of the exposed first workfunction-setting metal layer 602, the remaining portions of sacrificial layer 702 are removed (e.g., by ashing). What remains is high-κ gate dielectric 202 and first workfunction-setting metal layer 602 along the sidewalls of fins 104, along the top surface of bottom spacers 110, and along the bottom surface of top spacers 116.

Figure 9:
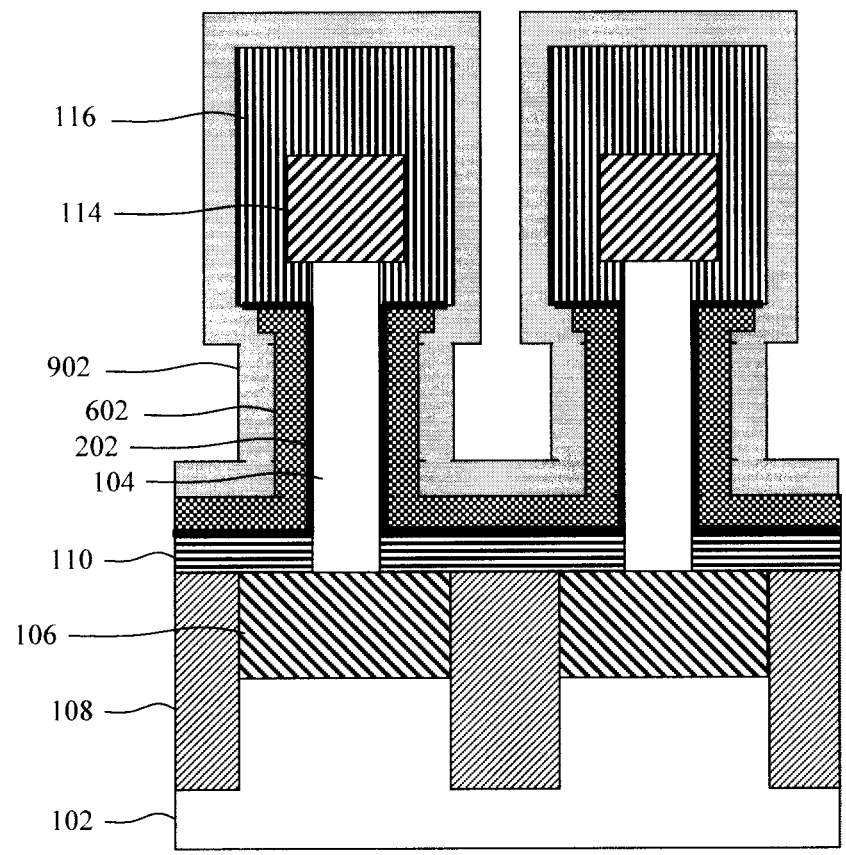
FIG. 9 is a cross-sectional diagram illustrating a second workfunction-setting metal layer having been deposited onto the first workfunction-setting metal layer (i.e., along the sidewalls of the fins) as well as over the bottom and top spacers to form the replacement metal gates of VFET1 and VFET2 according to an embodiment of the present invention.
Figure 10:
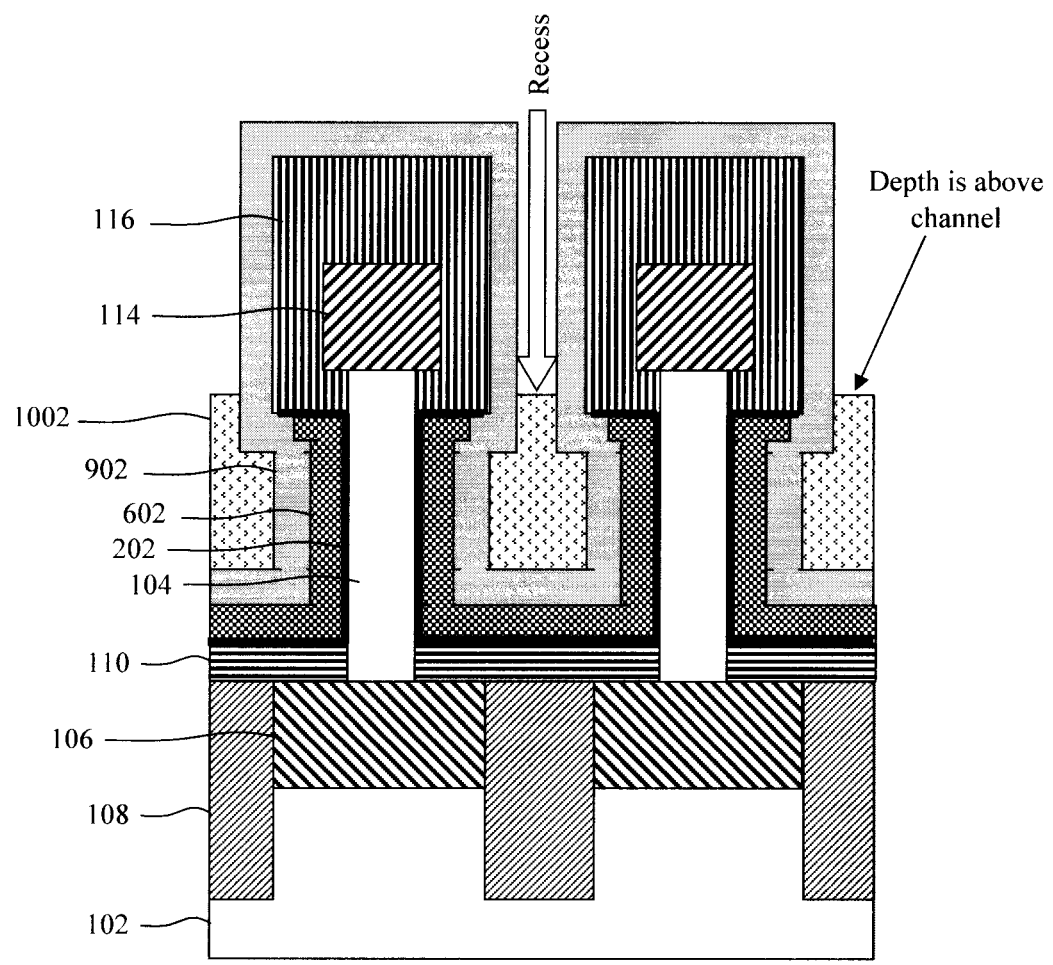
FIG. 10 is a cross-sectional diagram illustrating the fins having been buried in a (third) sacrificial layer which is then recessed to a depth above the vertical channels according to an embodiment of the present invention.
Figure 11:
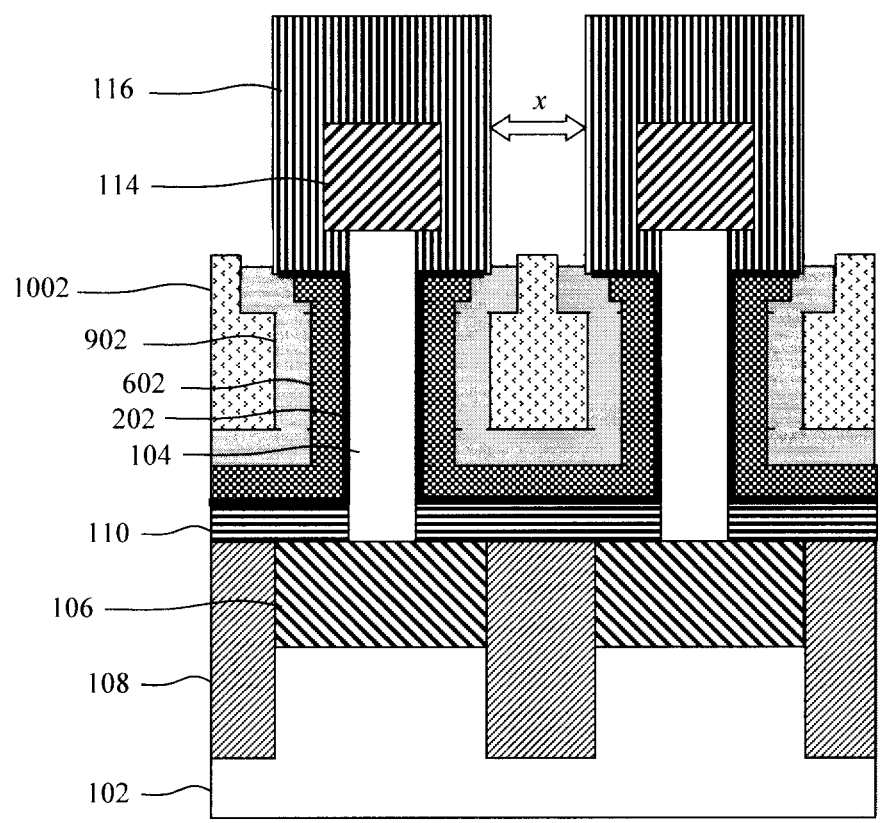
FIG. 11 is a cross-sectional diagram illustrating the second workfunction-setting metal layer exposed by recessing of the third sacrificial layer having been removed (via chamfering) selective to the top spacers according to an embodiment of the present invention.

Next, as shown in FIG. 9, a second workfunction-setting metal layer 902 is then deposited onto the first workfunction-setting metal layer 602 (i.e., along the sidewalls of fins 104) as well as over the bottom and top spacers 110 and 116, respectively. In the same manner as described above, second workfunction-setting metal layer 902 can be configured to produce a desired Vt and/or for one type of polarity, e.g., nVFET or pVFET. Namely, according to one exemplary embodiment, second workfunction-setting metal layer 902 includes a single-element metal, e.g., Co, Ti, Al, and/or other metal alloys that provide proper workfunction to produce a desired Vt, TiN, TaN, TiC and/or TiAl, and can be conformally deposited using a process such as CVD, ALD or PVD to a thickness of from about 5 nm to about 40 nm and ranges therebetween. In another exemplary embodiment, the metal(s) selected for second workfunction-setting metal layer 902 may be different for nVFETs and pVFETs, and can be formed using processes known in the art for selectively depositing second workfunction-setting metal layer 902 containing the appropriate metal(s) for the nVFETs and pVFETs. For instance, by way example only, suitable n-type workfunction-setting metals include, but are not limited to, TiN, TaN and/or Al-containing alloys such as TiAl, TiAlN, TiAlC, TaAl, TaAlN, and/or TaAlC. Suitable p-type workfunction-setting metals include, but are not limited to, TiN, TaN, and W. Thus, the second workfunction-setting metal layer 902 for nVFETs and pVFETs could be different materials which also may have different thickness.

It is notable that the first workfunction-setting metal layer 602 has already been removed from some regions of the device. As such, the second workfunction-setting metal layer 902 is only present in those regions at this stage in the process. For instance, since the first workfunction-setting metal layer 602 was previously removed from the top/sidewall regions of top spacers 116, second workfunction-setting metal layer 902 is now only present in those regions.

As highlighted above, a chamfering process is then used to remove second workfunction-setting metal layer 902 from the opening x between the adjacent top spacers 116. Namely, in the same manner as described above, fins 104 are buried in a (third) sacrificial layer 1002 (e.g., an OPL), which is then recessed (e.g., using an anisotropic etch, isotropic etch or combined etch having both anisotropic and isotropic components). See FIG. 10. In this step, the depth of sacrificial layer 1002 is above the vertical channels (i.e., the portions of the fins 104 in between the bottom and top spacers 110 and 116).

The second workfunction-setting metal layer 902 exposed by recessing of sacrificial layer 1002 is then removed (via this chamfering step) selective to top spacers 116. See FIG. 11. Doing so removes the second workfunction-setting metal layer 902 from the opening x between the adjacent top spacers 116. According to an exemplary embodiment, the exposed second workfunction-setting metal layer 902 is removed using a non-directional (isotropic) etching process, e.g., NH$_4$OH, H$_2$O$_2$, and/or SC1.

Figure 12:
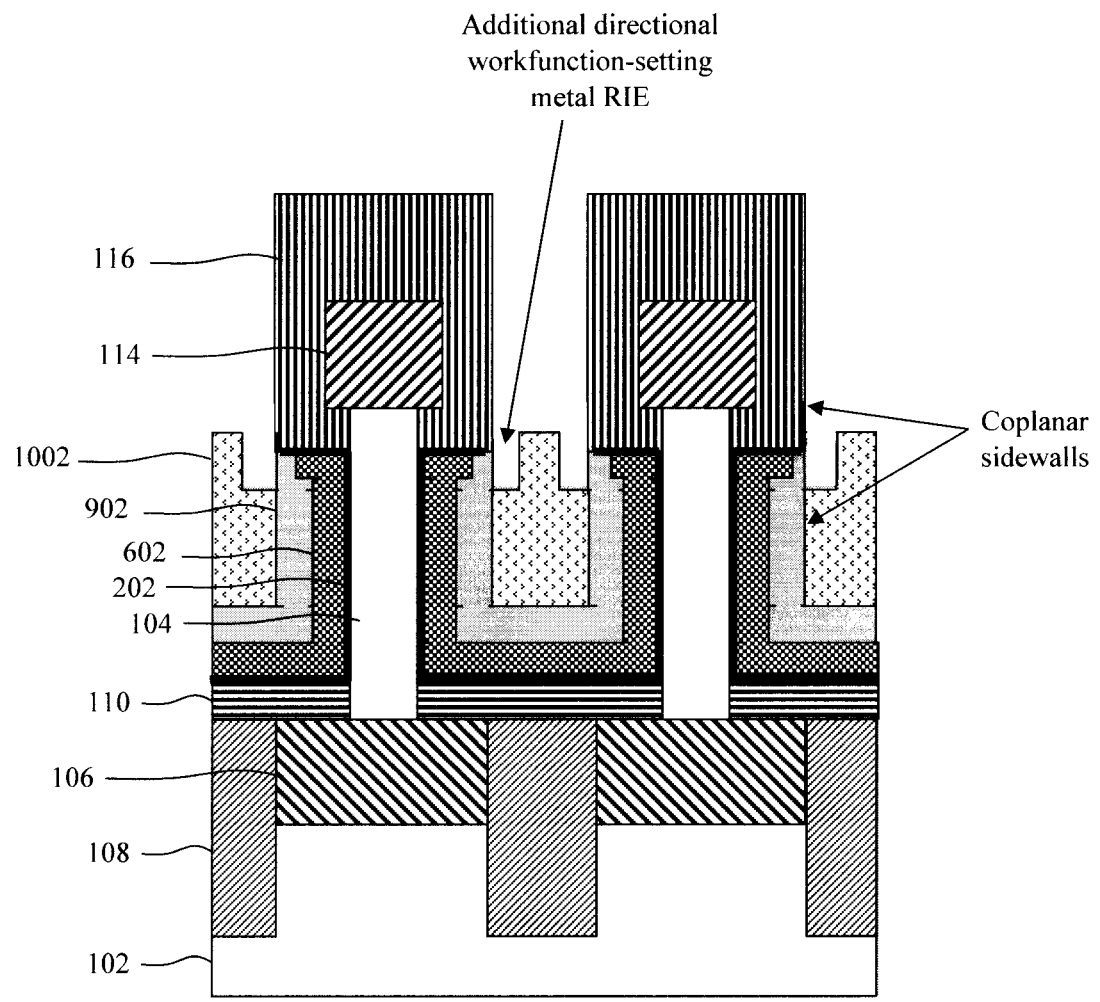
FIG. 12 is a cross-sectional diagram illustrating an additional cut of the second workfunction-setting metal layer having been performed according to an embodiment of the present invention.

As shown in FIG. 12, an additional cut of the second workfunction-setting metal layer 902 can be performed using a directional (anisotropic) etching process such as RIE. As shown in FIG. 12, this produces a sidewall of the second workfunction-setting metal layer 902 that is substantially coplanar with that of the top spacers 116.

Figure 13:
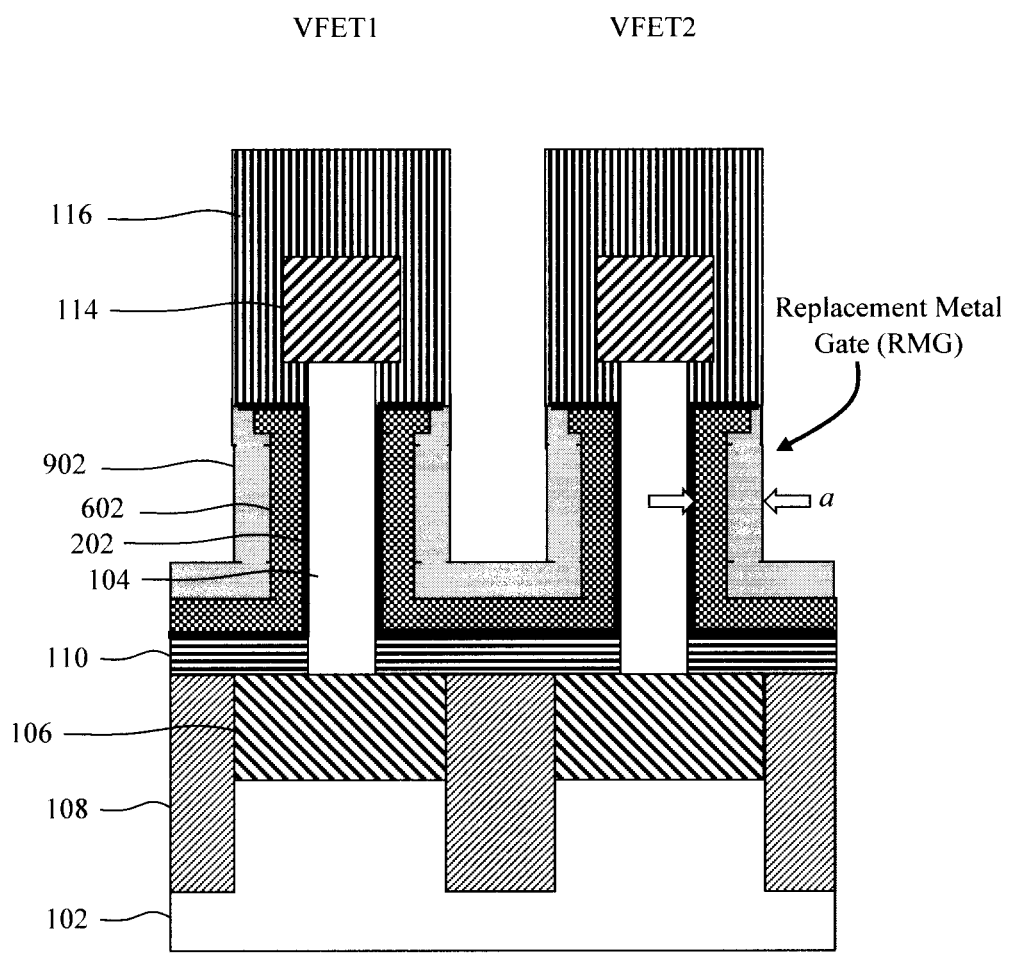
FIG. 13 is a cross-sectional diagram illustrating the remaining portions of the third sacrificial layer having been removed according to an embodiment of the present invention.

As shown in FIG. 13, the remaining portions of sacrificial layer 1002 are removed (e.g., by ashing). What remains is high-κ gate dielectric 202, first workfunction-setting metal layer 602 and second workfunction-setting metal layer 902 along the sidewalls of fins 104, along the top surface of bottom spacers 110, and along the bottom surface of top spacers 116, which form the replacement metal gate (RMGs) of a (first) VFET device (VFET1) and a second VFET device (VFET2).

It is notable that, in the instant example, the space a under the top spacers 116 is equal to the sum of the thicknesses of the first workfunction-setting metal layer 602 and the second workfunction-setting metal layer 902. However, alternative embodiments are contemplated herein where the first workfunction-setting metal layer 602 and/or the second workfunction-setting metal layer 902 are made thinner, and that space a under the top spacers 116 is filled by additional (third, fourth, etc.) layers of workfunction-setting metal. Further, configurations are also contemplated herein where first workfunction-setting metal layer 602 is removed, and the space a under the top spacers 116 is only filled with the second workfunction-setting metal layer 902, or vice versa (i.e., the second workfunction-setting metal layer 902 is removed and the space a under the top spacers 116 is only filled with the first workfunction-setting metal layer 602), optionally in combination with additional (third, fourth, etc.) layers of workfunction-setting metal.

Figure 14:
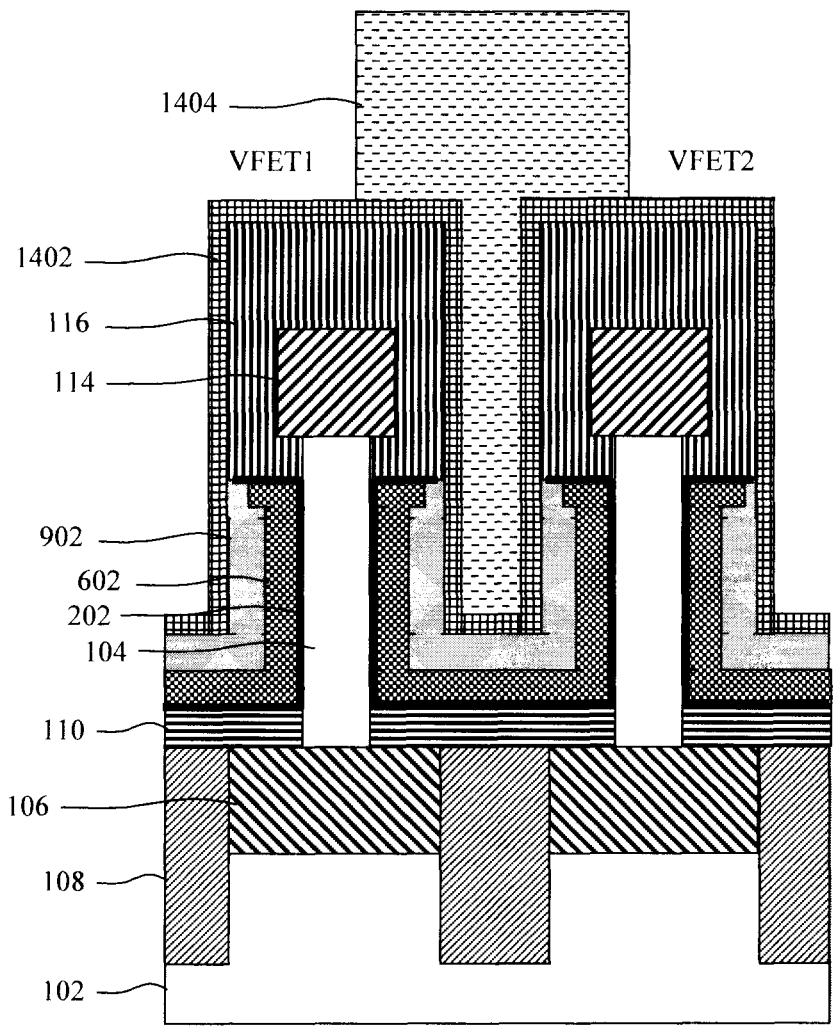
FIG. 14 is a cross-sectional diagram illustrating a liner having been deposited onto the top spacers and the replacement metal gates, and a gate patterning mask having been formed on the liner covering/masking a portion of the liner in between the fins according to an embodiment of the present invention.

As shown in FIG. 14, a liner 1402 is then deposited onto the top spacers 116 and RMGs. Suitable materials for liner 1402 include, but are not limited to, nitride liner materials such as silicon nitride (SiN). Liner 1402 can be deposited using a conformal deposition process such as CVD, ALD or PVD. According to an exemplary embodiment, liner 1402 is deposited to a thickness of from about 1 nm to about 10 nm, and ranges therebetween. Preferably, liner 1402 is formed from a different material than the bottom/top spacers 110 and 116 in order to provide etch selectivity. For instance, to use an illustrative, non-limiting example, when liner 1402 is formed from a nitride material (e.g., SiN), bottom/top spacers 110 and 116 are preferably formed from an oxide material (e.g., $SiO_2$ and/or SiOC).

A gate patterning mask is then formed to define where the gate will remain. According to an exemplary embodiment, the gate patterning is done in a self-aligned manner. Namely, as shown in FIG. 14, a gate patterning mask 1404 is formed on the liner 1402 covering/masking a portion of the liner 1402 in between the fins 104. Suitable materials for gate patterning mask 1404 include, but are not limited to, an OPL material.

Figure 15:
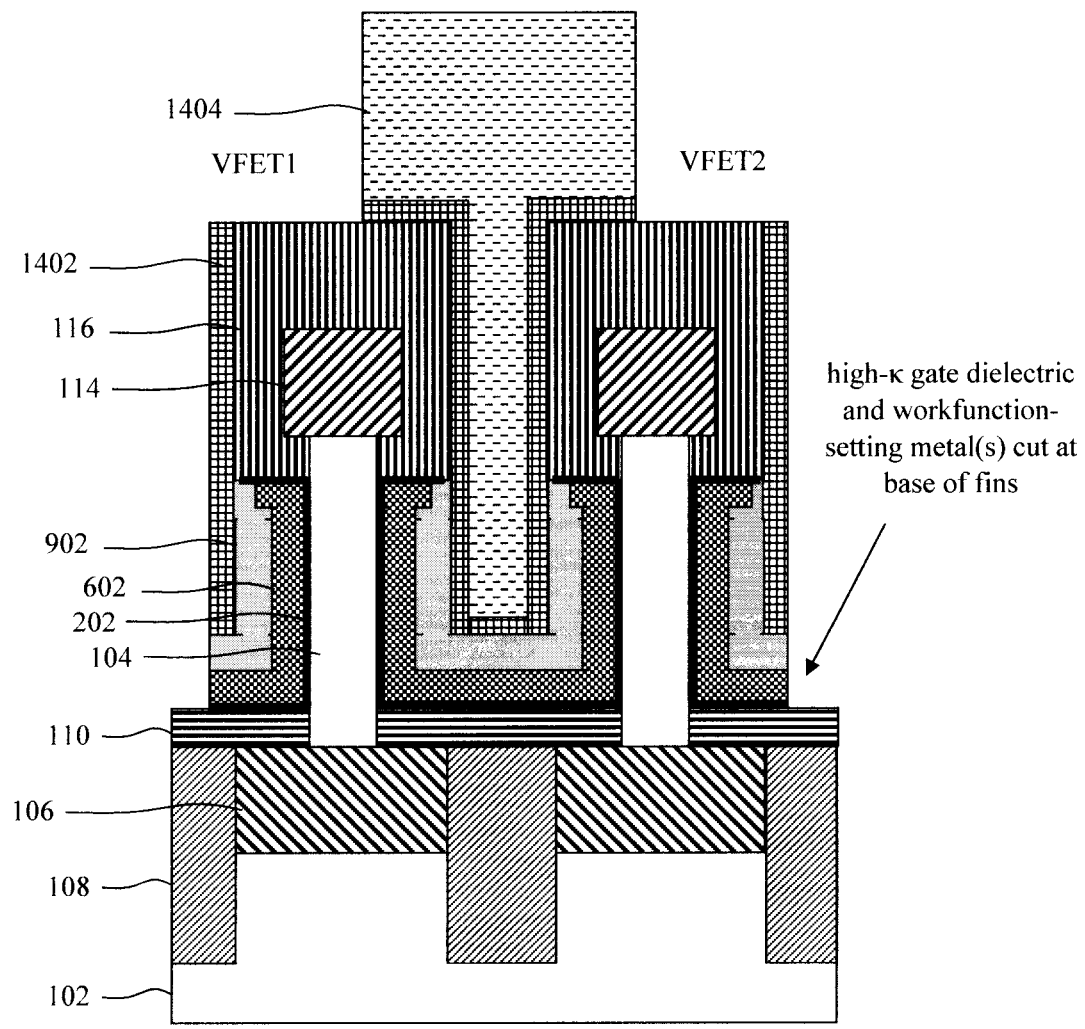
FIG. 15 is a cross-sectional diagram illustrating the gate patterning mask having been used to pattern the liner to remove the liner from all horizontal surfaces including those top surfaces of the top spacers not covered by the gate patterning mask according to an embodiment of the present invention.

As shown in FIG. 15, a selective directional (anisotropic) etching process such as a nitride-selective RIE and the gate patterning mask 1404 are then used to pattern the liner 1402. As shown in FIG. 15, this patterning step removes liner 1402 from all horizontal surfaces including those top surfaces of the top spacers 116 not covered by gate patterning mask 1404. The bottom and top spacers 110 and 116 can serve as an etch stop for the liner 1402 RIE. Doing so can cut the high-κ gate dielectric 202 and first/second workfunction-setting metal layers 602/902 at the base of fins 104 on an outer side of the fins 104. See FIG. 15. However, due to the presence of gate patterning mask 1404 in between the fins 104, the high-κ gate dielectric 202 and first/second workfunction-setting metal layers 602/902 remain intact at the base of fins 104 on an inner side of the fins 104.

Following patterning of liner 1402, gate patterning mask 1404 is removed and the devices (VFET1, VFET2, etc.) are buried/surrounded in an interlayer dielectric (ILD) 1602, followed by a polishing process such as chemical-mechanical polishing (CMP). See FIG. 16. Suitable ILDs include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

A top source and drain contact 1604 is then formed in ILD 1602/top spacer 116 in contact with the top source and drains 114 of at least one of the devices (VFET1, VFET2, etc.). See FIG. 16. To form top source and drain contact 1604, standard lithography and etching techniques are used to pattern a contact via in ILD 1602/top spacer 116 that extends down to the top source and drains 114. The contact via is then filled with a contact metal or metals, such as nickel (Ni), platinum (Pt), copper (Cu), cobalt (Co), ruthenium (Ru) and/or tungsten (W), followed by a polishing process such as CMP. The top source and drain contact 1604 is self-aligned to the top source and drains 114 in the sense that top source and drain contact 1604 extends through the portion of the top spacer 116 not covered by liner 1402. By way of the present process, the portion of the top spacer 116 not covered by liner 1402 is aligned with the top source and drains 114. It is notable that bottom source and drain and gate contacts are not shown in the figures as they are present in other regions of the devices which are not depicted in this cross-section.

Figure 16:
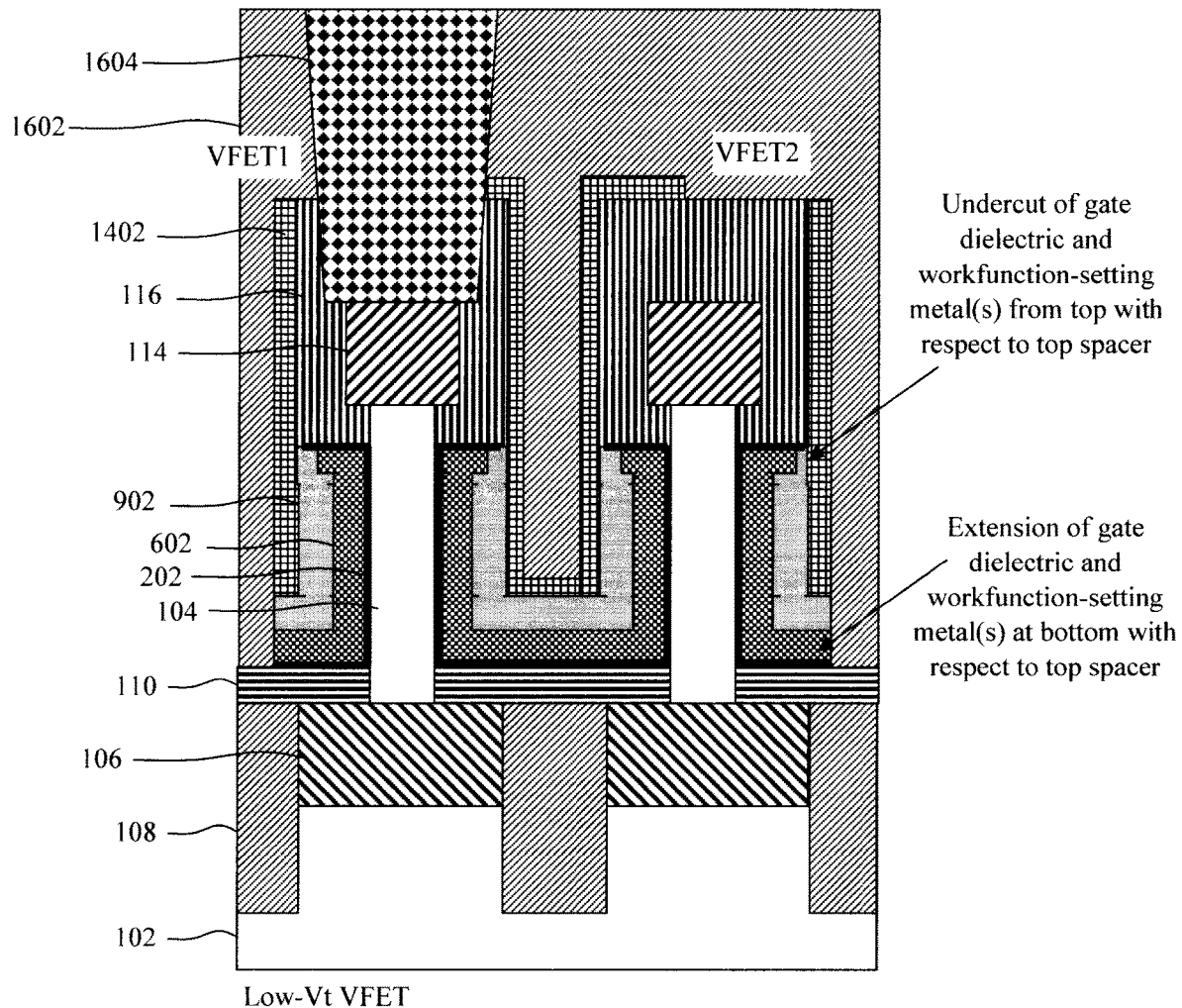
FIG. 16 is a cross-sectional diagram illustrating the gate patterning mask having been removed, the devices (VFET1, VFET2, etc.) having been buried in an interlayer dielectric (ILD), and a top source and drain contact having been formed in the ILD/top spacer in contact with the top source and drains of at least one of the devices according to an embodiment of the present invention.

As shown in FIG. 16, the resulting VFET device has a unique structure, whereby the high-κ gate dielectric 202 and first/second workfunction-setting metal layers 602/902 are undercut with respect to the top spacers 116 at a top of the fins 104. By 'undercut' it is meant that, at the top of fins 104, the high-κ gate dielectric 202 and first/second workfunction-setting metal layers 602/902 do not protrude laterally out from the sidewalls of fins 104 beyond top spacers 116. On the other hand, the high-κ gate dielectric 202 and first/second workfunction-setting metal layers 602/902 are extended with respect to the top spacers 116 at a bottom of the fins 104. By 'extended' it is meant that, at the bottom of fins 104, the high-κ gate dielectric 202 and first/second workfunction-setting metal layers 602/902 protrude laterally out from the sidewalls of fins 104 beyond top spacers 116.

Figure 17:
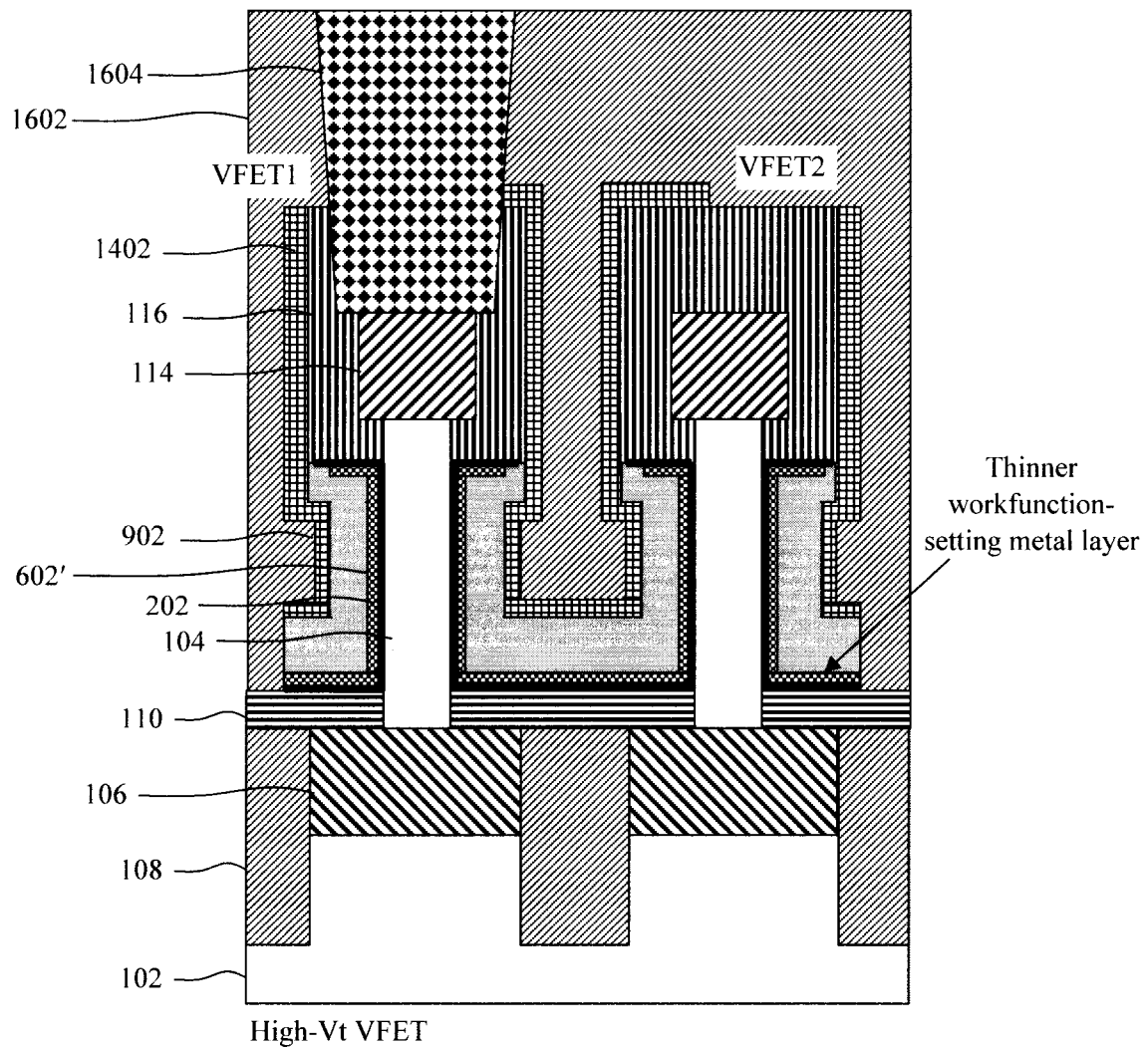
FIG. 17 is a cross-sectional diagram illustrating, according to an alternative embodiment, a thickness of the first workfunction-setting metal layer having been reduced to increase the threshold voltage (Vt) according to an embodiment of the present invention.

As highlighted above, alternative embodiments are also considered herein where a thickness of the first and/or second workfunction-setting metal layers 602 and/or 902 are varied to achieve a desired threshold voltage. For instance, to use an illustrative, non-limiting example, in the device depicted in FIG. 16 the first workfunction-setting metal layer 602 can have a thickness of from about 5 nanometers (nm) to about 15 nm and ranges therebetween, and the second workfunction-setting metal layer 902 can have a thickness of from about 8 nm to about 20 nm and ranges therebetween. By comparison, as shown in FIG. 17 the thickness of the first workfunction-setting metal layer (given reference numeral 602') can be reduced to increase the Vt. For instance, first workfunction-setting metal layer 602' can have a thickness of from about 1 nm to about 5 nm and ranges therebetween. Doing so increases the Vt, i.e., the device shown in FIG. 16 is a low-Vt VFET while the device shown in FIG. 17 is a high-Vt FET.

Figure 18:
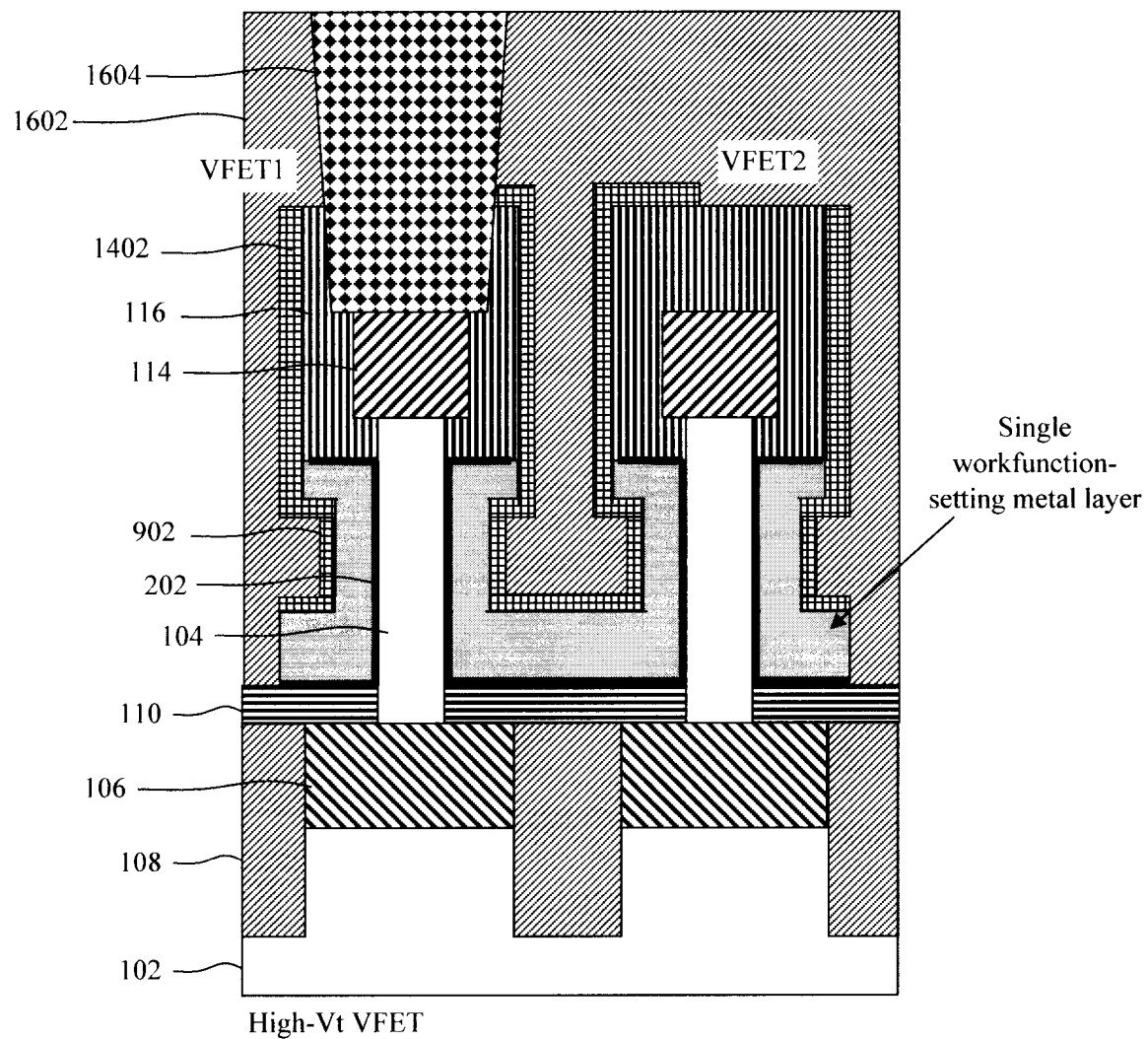
FIG. 18 is a cross-sectional diagram illustrating, according to an alternative embodiment, the first workfunction-setting metal layer having been removed in its entirety according to an embodiment of the present invention.

Further, as highlighted above, alternative embodiments are also considered herein where first workfunction-setting metal layer 602 or second workfunction-setting metal layer 902 are removed. For instance, as shown in FIG. 18, first workfunction-setting metal layer 602 is removed in its entirety. Doing so increases the Vt, but less so than employing a thinner workfunction-setting metal layer (as in FIG. 17). Thus, the device shown in FIG. 16 is a low-Vt VFET, the device shown in FIG. 17 is a high-Vt FET, and the device shown in FIG. 18 is a regular Vt (RVt) device.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical field effect transistor (VFET) device, comprising:
    fins patterned adjacent to one another in a substrate corresponding to at least a first VFET (VFET1) and a second VFET (VFET2);
    bottom source and drains formed in the substrate at a base of the fins;

bottom spacers disposed over the bottom source and drains;

top source and drains formed at a top of the fins;

top spacers surrounding the top source and drains, wherein the top spacers overhang the fins;

gates of the VFET1 and the VFET2 comprising: a high-κ gate dielectric disposed along sidewalls of the fins and on top surfaces of the bottom spacers and bottom surfaces of the top spacers, at least a first workfunction-setting metal layer disposed on the high-κ gate dielectric, and at least a second workfunction-setting metal layer disposed on the first workfunction-setting metal layer; and a liner disposed on the gates and on selected portions of the top spacers, wherein the liner directly contacts a top horizontal surface of the top spacers, and wherein the gates fully separate the liner from the bottom spacers.

2. The VFET device of claim 1, further comprising:

an ILD surrounding the VFET 1 and the VFET2; and at least one top source and drain contact present in the ILD that extends down through at least one of the top spacers to at least one of the top source and drains, wherein the at least one top source and drain contact extends through a portion of the at least one top spacer not covered by the liner.

3. The VFET device of claim 1, wherein the high-κ gate dielectric, the first workfunction-setting metal layer, and the second workfunction-setting metal layer are undercut with respect to the top spacers at a top of the fins.

4. The VFET device of claim 1, wherein the high-κ gate dielectric, the first workfunction-setting metal layer, and the second workfunction-setting metal layer are extended with respect to the top spacers at a bottom of the fins.

5. The VFET device of claim 1, wherein the high-κ gate dielectric is selected from the group consisting of: hafnium oxide ($HfO_2$), lanthanum oxide ($La_2O_3$), zirconium oxide ($ZrO_2$), aluminum oxide ($Al_2O_3$), titanium oxide ($TiO_2$), tantalum oxide ($Ta_2O_5$), and combinations thereof, and wherein the first workfunction-setting metal layer and the second workfunction-setting metal layer each comprises a metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

6. The VFET device of claim 3, wherein, at the top of fins, the high-κ gate dielectric, the first workfunction-setting metal layer, and the second workfunction-setting metal layer protrude laterally out from the sidewalls of the fins no farther than a sidewall of the top spacers.

7. The VFET device of claim 1, wherein horizontal portions of the high-κ gate dielectric, the first workfunction-setting metal layer, and the second workfunction-setting metal layer at a bottom of the fins extend laterally out farther than portions of the high-κ gate dielectric, the first workfunction-setting metal layer, and the second workfunction-setting metal layer at the top of the fins.

8. The VFET device of claim 1, wherein the second workfunction-setting metal layer and the top spacers have coplanar sidewalls, and wherein the liner directly contacts the coplanar sidewalls.

\* \* \* \* \*